(12) United States Patent
Hanna

(10) Patent No.: US 6,449,328 B1
(45) Date of Patent: Sep. 10, 2002

(54) METHOD AND APPARATUS FOR SHIFTING DATA FROM REGISTERS

(75) Inventor: Stephen Dale Hanna, Longmont, CO (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/571,668

(22) Filed: May 15, 2000

(51) Int. Cl.[7] ............................................... G11C 19/00
(52) U.S. Cl. .............................. 377/64; 377/69; 377/75
(58) Field of Search ............................. 377/64, 69, 75

(56) References Cited

U.S. PATENT DOCUMENTS

| | | | |
|---|---|---|---|
| 3,961,750 A | 6/1976 | Dao ............................ | 235/164 |
| 4,125,873 A | 11/1978 | Chesarek ..................... | 364/900 |
| 4,484,187 A | 11/1984 | Brown et al. ................ | 340/703 |
| 4,570,233 A | 2/1986 | Yan et al. .................... | 364/522 |
| 4,642,676 A | 2/1987 | Weinger ....................... | 358/22 |
| 4,675,666 A | 6/1987 | Peterson ..................... | 340/721 |
| 4,700,181 A | 10/1987 | Maine et al. ................ | 340/747 |
| 4,918,626 A | 4/1990 | Watkins et al. .............. | 364/522 |
| 4,924,414 A | 5/1990 | Ueda ........................... | 364/522 |
| 4,951,229 A | 8/1990 | DiNicola et al. ............ | 364/521 |
| 5,058,040 A | 10/1991 | Tajima ........................ | 364/522 |
| 5,359,432 A | 10/1994 | Peltzer et al. ................ | 358/452 |
| 5,454,071 A | 9/1995 | Siverbrook et al. .......... | 395/141 |
| 5,477,543 A | 12/1995 | Purcell ........................ | 370/112 |
| 5,621,869 A | 4/1997 | Drews ......................... | 395/135 |
| 5,732,248 A | 3/1998 | Prouty et al. ................ | 395/521 |
| 5,751,291 A | 5/1998 | Olsen et al. ................. | 345/422 |
| 5,754,180 A | 5/1998 | Kivolowitz et al. ......... | 345/418 |
| 5,760,780 A | 6/1998 | Larson et al. ............... | 345/422 |
| 5,781,197 A | 7/1998 | Saunders .................... | 345/430 |
| 5,835,095 A | 11/1998 | Smith et al. ................ | 345/421 |
| 5,844,828 A | 12/1998 | Fujimura et al. ....... | 364/715.08 |
| 5,852,711 A | 12/1998 | Campbell .................... | 395/117 |
| 5,852,742 A | 12/1998 | Vondran, Jr. et al. ... | 395/800.28 |
| 5,857,035 A | 1/1999 | Rust ............................ | 382/247 |
| 5,948,050 A | 9/1999 | Diamondstein et al. ..... | 708/209 |
| 5,949,909 A | 9/1999 | Kao et al. ................... | 382/233 |
| 5,960,115 A | 9/1999 | Kao et al. ................... | 382/233 |
| 6,006,244 A | 12/1999 | Mahurin ..................... | 708/209 |

FOREIGN PATENT DOCUMENTS

| | | |
|---|---|---|
| EP | 0886205 | 12/1998 |
| EP | 0886208 | 12/1998 |
| EP | 0886235 | 12/1998 |
| EP | 0886435 | 12/1998 |
| JP | 421077 | 4/1992 |

Primary Examiner—Margaret R. Wambach
(74) Attorney, Agent, or Firm—David W. Victor; Konrad Raynes Victor & Mann

(57) ABSTRACT

Disclosed is a method and apparatus for shifting data from registers. Bits from N registers are shifted as input to a first set of M multiplexors. Control signals are sent into each of the first set of M multiplexors to select bits inputted from one of the registers. The selected bits are outputted to each of a second set of M multiplexors. Control signals are then sent into each of the second set of M multiplexors to select bits inputted from each of the first set of multiplexors.

36 Claims, 4 Drawing Sheets

| Control Word 3 2 1 0 | OUT3 | OUT2 | OUT1 | OUT0 |
|---|---|---|---|---|
| 0 0 0 0 | Byte 00 | Byte 01 | Byte 02 | Byte 03 |
| 0 0 0 1 | Byte 01 | Byte 02 | Byte 03 | Byte 04 |
| 0 0 1 0 | Byte 02 | Byte 03 | Byte 04 | Byte 05 |
| 0 0 1 1 | Byte 03 | Byte 04 | Byte 05 | Byte 06 |
| 0 1 0 0 | Byte 04 | Byte 05 | Byte 06 | Byte 07 |
| 0 1 0 1 | Byte 05 | Byte 06 | Byte 07 | Byte 08 |
| 0 1 1 0 | Byte 06 | Byte 07 | Byte 08 | Byte 09 |
| 0 1 1 1 | Byte 07 | Byte 08 | Byte 09 | Byte 10 |
| 1 0 0 0 | Byte 08 | Byte 09 | Byte 10 | Byte 11 |
| 1 0 0 1 | Byte 09 | Byte 10 | Byte 11 | Byte 12 |
| 1 0 1 0 | Byte 10 | Byte 11 | Byte 12 | Byte 13 |
| 1 0 1 1 | Byte 11 | Byte 12 | Byte 13 | Byte 14 |
| 1 1 0 0 | Byte 12 | Byte 13 | Byte 14 | Byte 15 |
| 1 1 0 1 | Byte 13 | Byte 14 | Byte 15 | Byte 00 |
| 1 1 1 0 | Byte 14 | Byte 15 | Byte 00 | Byte 01 |
| 1 1 1 1 | Byte 15 | Byte 00 | Byte 01 | Byte 02 |

METHOD AND APPARATUS FOR SHIFTING DATA FROM REGISTERS

BACKGROUND OF THE INVENTION

1. Field of the Invention

The present invention relates to a method and apparatus for shifting data from registers.

2. Description of the Related Art

A shifter circuit is used to shift a plurality of data bytes to another register where further computations may be performed. Prior art shifters typically utilize a barrel shifter to allow a plurality of bytes to be shifted to a fixed number of bytes. Certain data processing operations further require byte reordering. The reordering is typically performed by a separate multiplexer circuit.

To shift data, such as bytes, from N registers to M output bytes, an M N:1 multiplexors may be used. For instance, if there are sixteen one byte registers and data is shifted to select four bytes as output, then four 16:1 multiplexors may be used to select data from the sixteen registers and shift to four outputs. However, the larger the multiplexor, the more space and logical units the multiplexor requires to implement.

Thus, there is a need in the art for an improved shifter architecture for a shifter that utilizes fewer logical units for the multiplexor than that described above.

SUMMARY OF THE PREFERRED EMBODIMENTS

To overcome the limitations in the prior art described above, preferred embodiments disclose a method and apparatus for shifting data from registers. Bits from N registers are shifted as input to a first set of M multiplexors. Control signals are sent into each of the first set of M multiplexors to select bits inputted from one of the registers. The selected bits are outputted to each of a second set of M multiplexors. Control signals are then sent into each of the second set of M multiplexors to select bits inputted from each of the first set of multiplexors.

In further embodiments, a counter generates a control word. The control word is used to determine the control signals sent to each of the first and second sets of M multiplexors.

In still further embodiments, bits from the control word are used to determine bits to output as control signals to each of the first set of multiplexors. Bits are used from the control word as control signals to each of the second set of multiplexors.

Preferred embodiments provide a technique for implementing a barrel shifter data from registers while rotating through the registers in a manner that efficiently utilizes multiplexor circuits to reduce the number of multiplexor logical units needed to implement the barrel shifter.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

Figure 1:
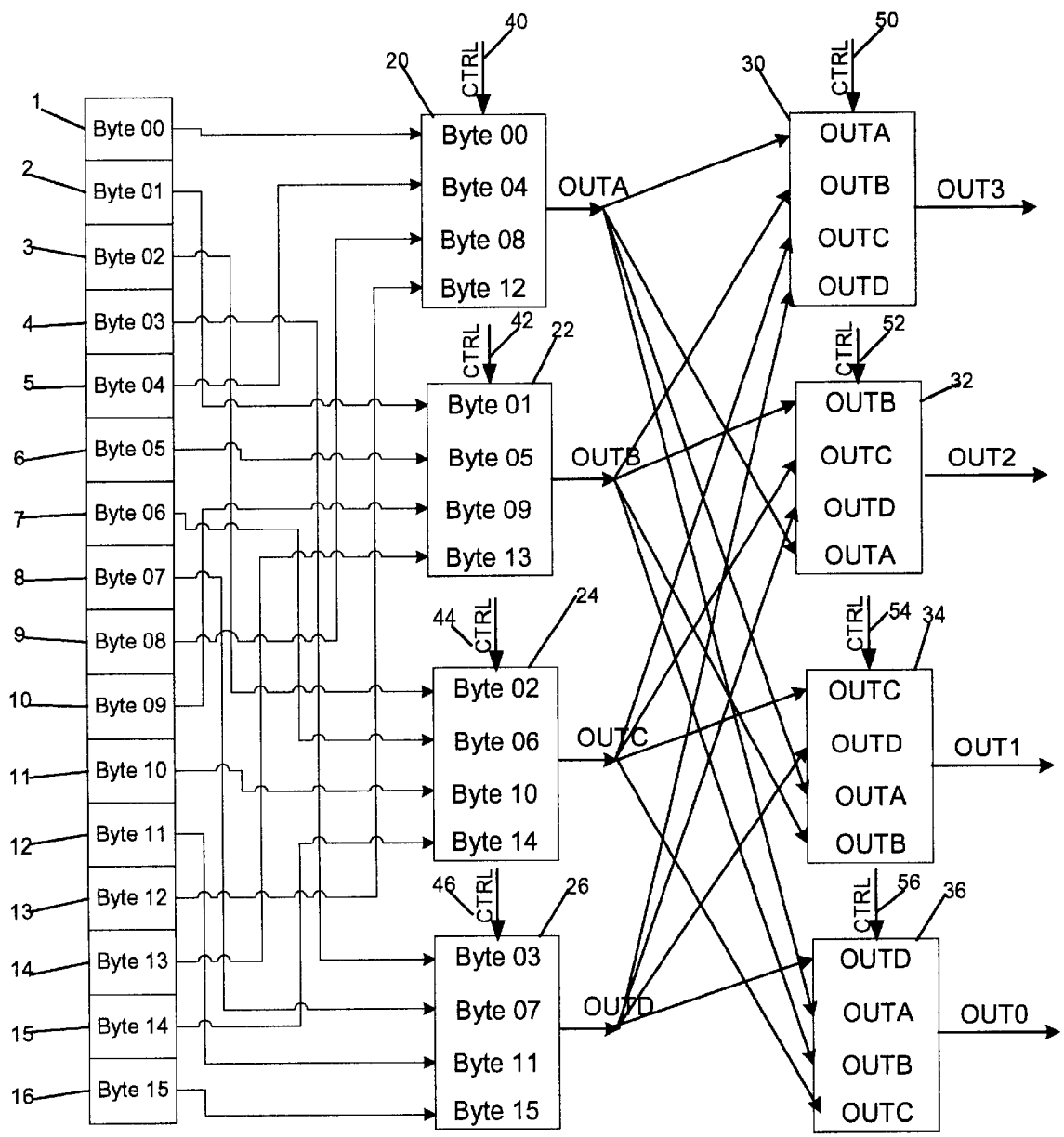
FIG. 1 illustrates an architecture of a barrel shifter in accordance with preferred embodiments of the present invention.

In the following description, reference is made to the accompanying drawings which form a part hereof and which illustrate several embodiments of the present invention. In the drawings, depicted elements are not necessarily drawn to scale and like or similar elements may be designated by the same reference numeral throughout the several views. Further, it is understood that other embodiments may be utilized and structural and operational changes may be made without departing from the scope of the present invention.

FIG. 1 illustrates a preferred architecture for a barrel shifter to rotate through byte registers 1–16 and shift bytes from four consecutive bytes registers. The architecture includes a first bank of multiplexors 20, 22, 24, and 26 and a second bank of multiplexors 30, 32, 34, and 36. Four byte registers 1–16 are coupled as inputs to one of the multiplexors 20, 22, 24, 26 as shown. Each of the multiplexors 20, 22, 24, 26 pass an output byte, OUTA, OUTB, OUTC, and OUTD, to each of the multiplexors 30, 32, 34, 36. Multiplexors 30, 32, 34, 36 then pass one output byte OUT0, OUT1, OUT2, OUT3.

Multiplexors 20, 22, 24, and 26 each receive two control bits 40, 42, 44, and 46, respectively, that select one of the four input bytes from the registers 1–16 to output as OUTA, OUTB, OUTC, and OUTD. The control bits indicate the position of the input byte to output, e.g., control bits of 00 cause the multiplexors 20, 22, 24, 26 to output Bytes 00, 01, 02, 03, respectively, control bits of 10 cause the output of Bytes 08, 09, 10, 11, etc. Multiplexors 30, 32, 34, and 36 also each receive two control bits 50, 52, 54, and 56, respectively, that select one of the four input bytes from each of the multiplexors 20, 22, 24, and 26 to output as OUT3, OUT2, OUT1, and OUT0. The control bits indicate the position of the input byte to output, e.g., control bits of 00 cause the multiplexors 30, 32, 34, 36 to output OUTA, OUTB, OUTC, and OUTD, respectively, control bits of 10 cause the output of OUTC, OUTD, OUTA, and OUTB, respectively.

Figures 2, 3:
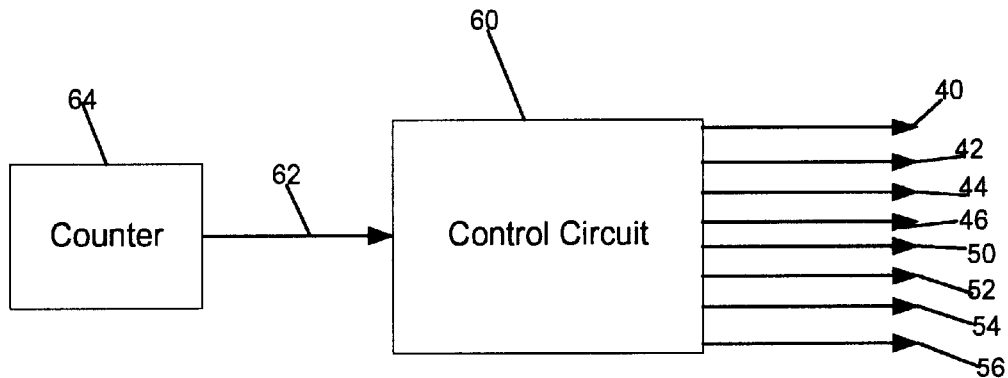
FIG. 2 illustrates the arrangement of a control circuit used to generate control signals to control how the multiplexors in the arrangement of FIG. 1 select inputs to output in accordance with preferred embodiments of the present invention.
FIG. 3 illustrates a table indicating the final output from the barrel shifter in FIG. 1 for different control words used to generate the control signals for the multiplexors in FIG. 1 in accordance with preferred embodiments of the present invention.

FIG. 2 illustrates a control circuit 60 that receives as input a four bit control word 62 from a 64 counter and simultaneously transmits two control bits 40, 42, 44, 46, 50, 52, 54, and 56 to control multiplexors 20, 22, 24, 26, 30, 32, 34, 36, respectively. FIG. 3 illustrates a table indicating the four register bytes 1–16 that are outputted by the two banks of multiplexors 20, 22, 24, 26 and 30, 32, 34, and 36 as OUT3, OUT2, OUT1, and OUT0 for each possible control word 62 value. In the table of FIG. 3, the bits of the control word are shown in reverse, 3, 2, 1, 0. The counter 64 increments the control word from 0000 to 1111. Upon reaching the last possible control word 1111, the counter 64 rolls-over back to control word 0000 to rotate through the byte registers 1–16, providing bytes of data from four consecutive registers 1–16. In this way, the barrel shifter shown in FIG. 1 of the preferred embodiments steps downward through the byte registers 1–16, outputting four bytes of data.

Figure 4:
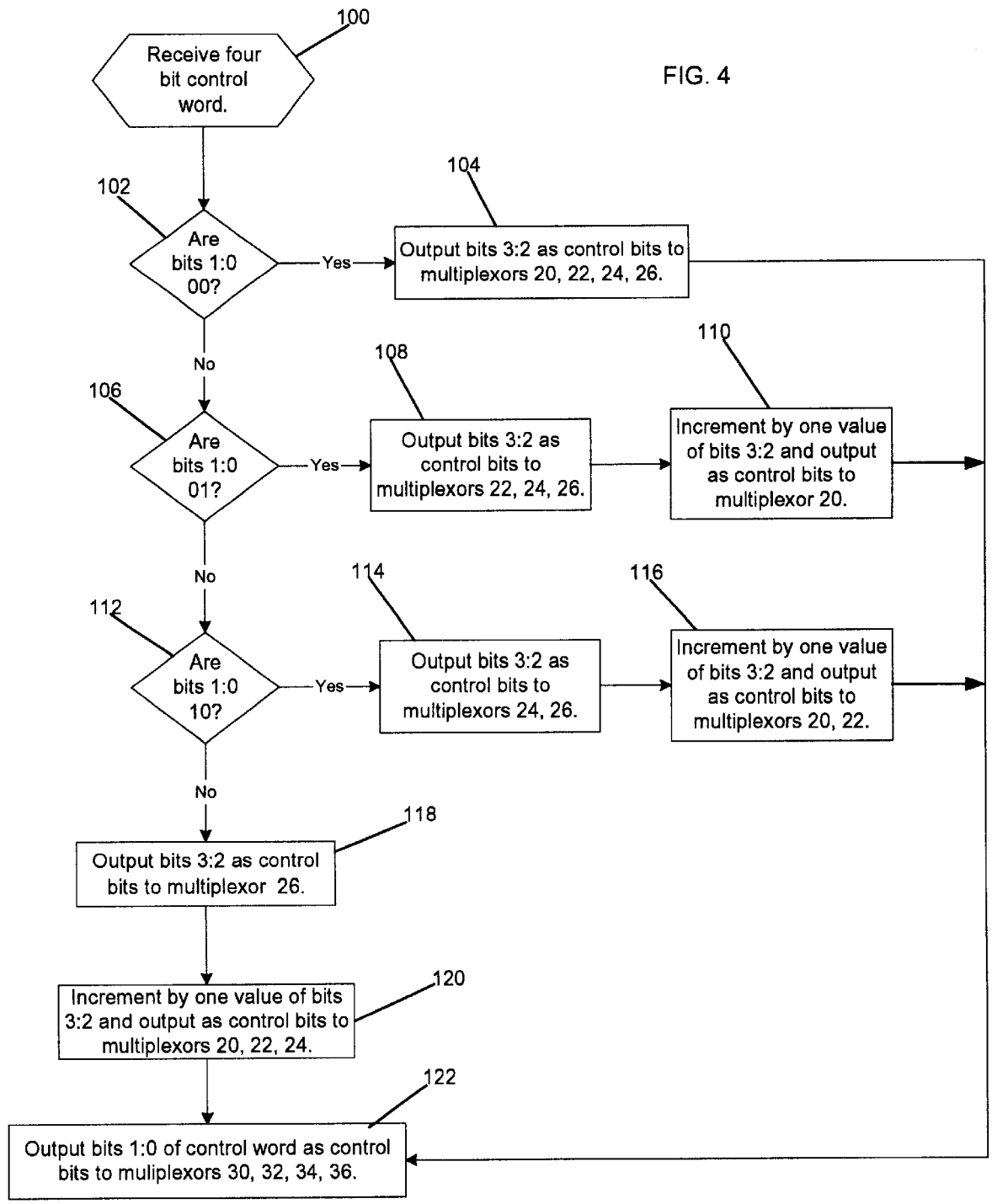
FIG. 4 illustrates logic implemented in the control circuit to generate control signals to the multiplexors in FIG. 1 in accordance with preferred embodiments of the present invention.

FIG. 4 illustrates logic implemented in the control circuit 60 to output two control bits 40, 42, 44, 46, 50, 52, 54, and 56 to control the multiplexors 20, 22, 24, 26, 30, 32, 34, and 36, respectively. The logic of FIG. 4 may be expressed in the Verilog language. The control circuit 60 receives (at block 100) a four bit control word 62 from the counter 64. As discussed, the table in FIG. 3 shows the final output that should be produced by the two banks of multiplexors for the control word. If (at block 102) bits 1:0 of the control word 62 are 00, then the control circuit 60 outputs (at block 104) bits 3:2 of the control word 62 as control bits 40, 42, 44, and 46 to control multiplexors 20,22,24,26, respectively. If (at block 106) bits 1:0 are 01, then the control circuit 60 outputs (at block 108) bits 3:2 as control bits 42, 44, and 46 for multiplexors 22, 24, and 26, respectively. The control circuit 60 further simultaneously outputs (at block 110) the value of bits 3:2 incremented by one as the control bit 40 for multiplexor 20. Incrementing a value of 11 would result in a value of 00 to output, as the last possible value (11) rolls-over to the first possible value (00). If (at block 112) bits 1:0 are 10, then the control circuit 60 outputs (at block 114) bits 3:2 as control bits 44 and 46 for multiplexors 24 and 26, respectively and simultaneously outputs (at block 116) the value of bits 3:2 incremented by one as the control bits 40 and 42 for multiplexors 20 and 22. Otherwise, if bits 1:0 are 11, then the control circuit 60 outputs (at block 1 18) bits 3:2 as control bits 46 to multiplexor 26 and increments (at block 120) by one the value of bits 1:0 to output as control bits 40, 42, and 44 to multiplexors 20, 22, and 24, respectively.

After the first bank of multiplexors 20, 22, 24, and 26 shift one output byte OUTA, OUTB, OUTC, and OUTD to the second bank of multiplexors 30, 32, 34, and 36, the control circuit 60 on another clock cycle would output bits 1:0 of the control word 62 as control bits 50, 52, 54, 56 to control the multiplexor selection of one input byte to output as OUT3, OUT2, OUT1, OUT0. The end result is producing bytes from four consecutive byte registers 1–16 to produce the output shown in the table of FIG. 3 corresponding four bit control word.

In this way, this arrangement of multiplexors rotates through the byte registers 1–16, selecting four bytes to shift as output, as the counter sequences through the sixteen possible control word values. This architecture is an improvement over using four 16:1 multiplexors in a manner known in the art to select four bytes from the registers. In implementations where each one bit multiplexor comprises a functional unit, implementing four 16:1 multiplexors would require 160 functional units. The architecture of the preferred embodiments shown in FIG. 1 would utilize 70 functional blocks. Thus, the preferred embodiment architecture for a barrel shifter that reuses the selected output from the first bank of multiplexors as input to each of the multiplexors in the second bank uses less logic and requires less space than current methods known in the art for shifting multiple bytes from registers.

Figure 5:
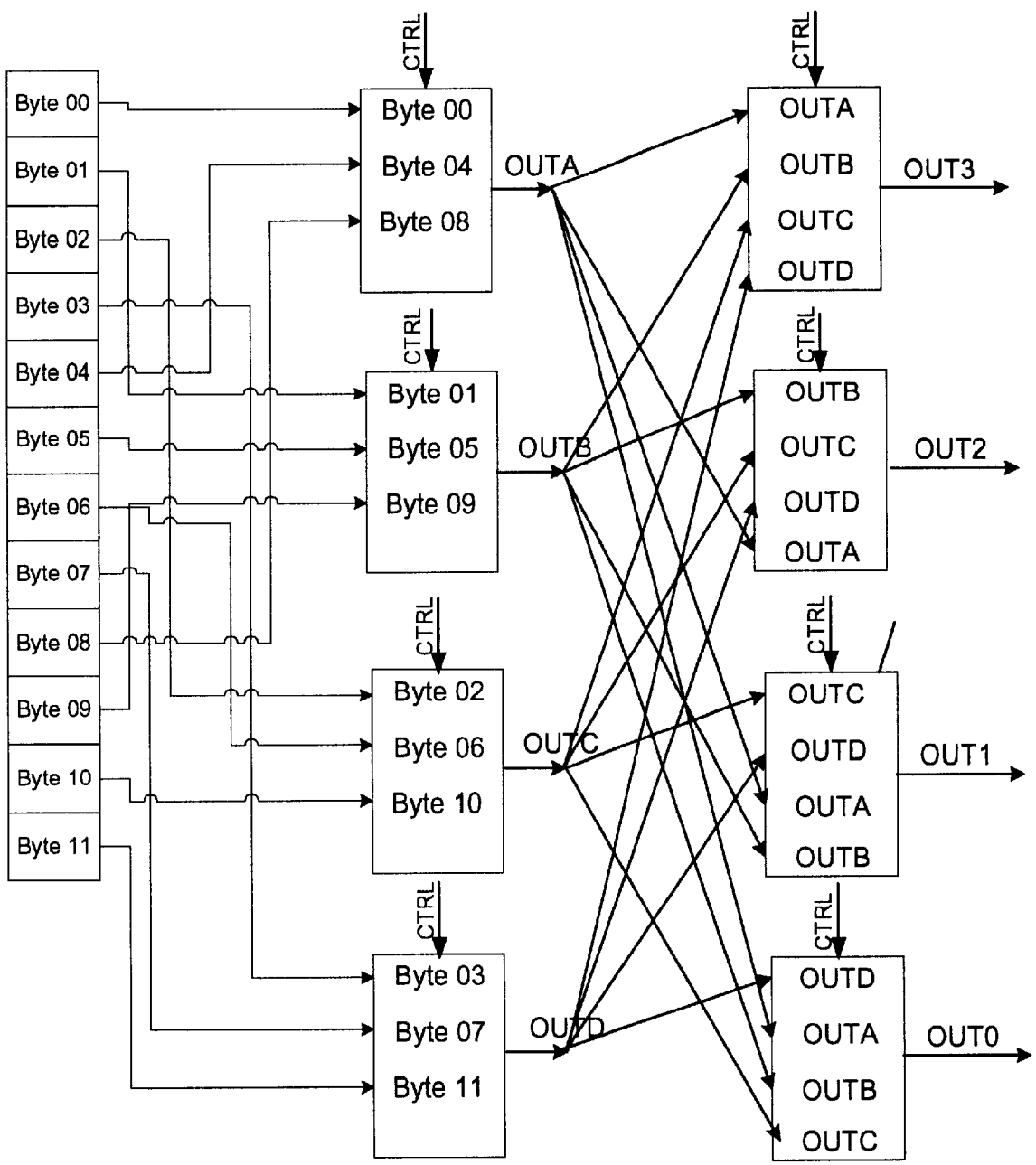
FIG. 5 illustrates an additional implementation of a barrel shifter architecture in accordance with implementations of the invention.

The preferred embodiments may apply to shifting more or less bytes from more or less byte registers than shown in FIG. 1. If there are M byte registers and N bytes to select from the registers, where M is an integer multiple of N, then there would be N multiplexors in each of the banks. However, the first bank of N multiplexors would each have M divided by N (M/N) inputs. Each of the first bank of N multiplexors would then produce an output byte as input to a second bank of N multiplexors. The logic described in FIG. 3 may then be used to determine control bits for each bank of multiplexors. The one modification is that the control bits for the first bank of multiplexors would include M/N possible values to select from the M/N inputs. FIG. 5 illustrates the case where there are twelve byte registers to provide as input and select four bytes as output to rotate through the byte registers.

The preferred embodiment barrel shifter may be used whenever shifting bytes or data from a group of registers to another circuit for further processing. Some examples of the uses of the preferred embodiment barrel shifter are described in the co-pending and commonly assigned patent application entitled "Method, System, And Program For Decompressing And Aligning Line Work Data From Multiple Objects", to Stephen D. Hanna, having attorney docket no. BLD920000002US1, which patent application is filed on the same date herewith and is incorporated herein by reference in its entirety. For instance, the barrel shifter of the preferred embodiments may be used to shift data from buffer registers to a decompressor circuit, aligner logic or any other logic component which further processes the data, such as the decompressor and aligner logic disclosed in the above referenced patent application, having attorney docket no. BLD920000002US1.

The foregoing description of the preferred embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method for shifting data from registers, comprising:
   shifting bits from N registers as input to a first set of M multiplexors;
   sending control signals into each of the first set of M multiplexors to select bits inputted from one of the registers;
   outputting the selected bits to each of a second set of M multiplexors; and
   sending control signals into each of the second set of M multiplexors to select bits inputted from each of the first set of multiplexors, wherein one outputted bit from each multiplexor in the first set is inputted to each multiplexor in the second set.

2. The method of claim 1, wherein each of the bits outputted from the first set of multiplexors are inputted to a different input position at each multiplexor in the second set.

3. A method for shifting data from registers, comprising:
   shifting bits from N registers as input to a first set of M multiplexors;
   sending control signals into each of the first set of M multiplexors to select bits inputted from one of the registers;
   outputting the selected bits to each of a second set of M multiplexors;
   sending control signals into each of the second set of M multiplexors to select bits inputted from each of the first set of multiplexors; and using a counter to generate a control word, wherein the control word is used to determine the control signals sent to each of the first and second sets of M multiplexors.

4. The method of claim 3, further comprising:

using bits from the control word to determine bits to output as control signals to each of the first set of multiplexors; and using bits from the control word as control signals to each of the second set of multiplexors.

5. The method of claim 4, wherein the bits used to determine the bits to output as control signals to the first set of multiplexors and the bits used as control signals to the second set of multiplexors are the same bits.

6. The method of claim 4, further comprising:

modifying bits from the control word to output as control signals to the first set of multiplexors if the bits used from the control word to determine bits to output as control signals to the first set of multiplexors have a first value.

7. The method of claim 6, wherein bits from the control word are outputted as control signals to the first set of multiplexors if the bits used from the control word to determine bits to output as control signals to the first set of multiplexors have a second value.

8. The method of claim 6, wherein modifying bits from the control word comprises incrementing a value of bits from the control word.

9. A method for shifting data from registers, comprising:

shifting bits from N registers as input to a first set of M multiplexors, wherein each register includes a byte of data;

sending control signals into each of the first set of M multiplexors to select bits inputted from one of the registers;

outputting the selected bits to each of a second set of M multiplexors; and sending control signals into each of the second set of M multiplexors to select bits inputted from each of the first set of multiplexors, wherein each input into the first and second set of multiplexors and the output from the first and second set of multiplexors comprises a byte of data.

10. A method for shifting data from registers, comprising:

shifting bits from N registers as input to a first set of M multiplexors;

sending control signals into each of the first set of M multiplexors to select bits inputted from one of the registers;

outputting the selected bits to each of a second set of M multiplexors; and sending control signals into each of the second set of M multiplexors to select bits inputted from each of the first set of multiplexors, wherein each of the M multiplexors in the first and second sets have N divided by M inputs.

11. The method of claim 10, further comprising:

using a counter to generate a four bit control word;

for each multiplexor in the first set, sending two bits of the control word to each multiplexor using two bits of the control word to determine the control signal for the multiplexor; and for each multiplexor in the second set, sending two bits of the control word to the multiplexor.

12. A system for shifting data from registers, comprising:

means for shifting bits from N registers as input to a first set of M multiplexors;

means for sending control signals into each of the first set of M multiplexors to select bits inputted from one of the registers;

means for outputting the selected bits to each of a second set of M multiplexors; and means for sending control signals into each of the second set of M multiplexors to select bits inputted from each of the first set of multiplexors, wherein one outputted bit from each multiplexor in the first set is inputted to each multiplexor in the second set.

13. The system of claim 12, wherein each of the bits outputted from the first set of multiplexors are inputted to a different input position at each multiplexor in the second set.

14. A system for shifting data from registers, comprising:

means for shifting bits from N registers as input to a first set of M multiplexors;

means for sending control signals into each of the first set of M multiplexors to select bits inputted from one of the registers;

means for outputting the selected bits to each of a second set of M multiplexors;

means for sending control signals into each of the second set of M multiplexors to select bits inputted from each of the first set of multiplexors; and means for using a counter to generate a control word, wherein the control word is used to determine the control signals sent to each of the first and second sets of M multiplexors.

15. The system of claim 14, further comprising:

means for using bits from the control word to determine bits to output as control signals to each of the first set of multiplexors; and means for using bits from the control word as control signals to each of the second set of multiplexors.

16. The system of claim 15, wherein the bits used to determine the bits to output as control signals to the first set of multiplexors and the bits used as control signals to the second set of multiplexors are the same bits.

17. The system of claim 15, further comprising:

means for modifying bits from the control word to output as control signals to the first set of multiplexors if the bits used from the control word to determine bits to output as control signals to the first set of multiplexors have a first value.

18. The system of claim 17, wherein bits from the control word are outputted as control signals to the first set of multiplexors if the bits used from the control word to determine bits to output as control signals to the first set of multiplexors have a second value.

19. The system of claim 17, wherein the means for modifying bits from the control word comprises incrementing a value of bits from the control word.

20. A system for shifting data from registers, comprising:

means for shifting bits from N registers as input to a first set of M multiplexors; wherein each register includes a byte of data;

means for sending control signals into each of the first set of M multiplexors to select bits inputted from one of the registers, means for outputting the selected bits to each of a second set of M multiplexors; and means for sending control signals into each of the second set of M multiplexors to select bits inputted from each of the first set of multiplexors, wherein each into the first and second set of multiplexors and the first and second set of multiplexors comprises a byte of data.

21. A system for shifting data from registers, comprising:

means for shifting bits from N registers as input to a first set of M multiplexors;

means for sending control signals into each of the first set of M multiplexors to select bits inputted from one of the registers;

means for outputting the selected bits to each of a second set of M multiplexors; and means for sending control signals into each of the second set of M multiplexors to select bits inputted from each of the first set of multiplexors, wherein each of the M multiplexors in the first and second sets have N divided by M inputs.

22. The system of claim 21, further comprising:

means for using a counter to generate a four bit control word;

for each multiplexor in the first set, means for sending two bits of the control word to each multiplexor using two bits of the control word to determine the control signal for the multiplexor; and for each multiplexor in the second set, means for sending two bits of the control word to the multiplexor.

23. Logic for shifting data from registers, wherein the logic is capable of performing:

shifting bits from N registers as input to a first set of M multiplexors;

sending control signals into each of the first set of M multiplexors to select bits inputted from one of the registers;

outputting the selected bits to each of a second set of M multiplexors; and sending control signals into each of the second set of M multiplexors to select bits inputted from each of the first set of multiplexors, wherein one outputted bit from each multiplexor in the first set is inputted to each multiplexor in the second set.

24. The logic of claim 23, wherein each of the bits outputted from the first set of multiplexors are inputted to a different input position at each multiplexor in the second set.

25. Logic for shifting data from registers, wherein the logic is capable of performing:

shifting bits from N registers as input to a first set of M multiplexors;

sending control signals into each of the first set of M multiplexors to select bits inputted from one of the registers;

outputting the selected bits to each of a second set of M multiplexors;

sending control signals into each of the second set of M multiplexors to select bits inputted from each of the first set of multiplexors; and using a counter to generate a control word, wherein the control word is used to determine the control signals sent to each of the first and second sets of M multiplexors.

26. The logic of claim 25, wherein the logic is further capable of performing:

using bits from the control word to determine bits to output as control signals to each of the first set of multiplexors; and using bits from the control word as control signals to each of the second set of multiplexors.

27. The logic of claim 26, wherein the bits used to determine the bits to output as control signals to the first set of multiplexors and the bits used as control signals to the second set of multiplexors are the same bits.

28. The logic of claim 26, wherein the logic is further capable of performing:

modifying bits from the control word to output as control signals to the first set of multiplexors if the bits used from the control word to determine bits to output as control signals to the first set of multiplexors have a first value.

29. The logic of claim 28, wherein bits from the-control word are outputted as control signals to the first set of multiplexors if the bits used from the control word to determine bits to output as control signals to the first set of multiplexors have a second value.

30. The logic of claim 28, wherein modifying bits from the control word comprises incrementing a value of bits from the control word.

31. Logic for shifting data from registers, wherein the logic is capable of performing:

shifting bits from N registers as input to a first set of M multiplexors, wherein each register includes a byte of data;

sending control signals into each of the first set of M multiplexors to select bits inputted from one of the registers;

outputting the selected bits to each of a second set of M multiplexors;

sending control signals into each of the second set of M multiplexors to select bits inputted from each of the first set of multiplexors, wherein each input into the first and second set of multiplexors and the output from the first and second set of multiplexors comprises a byte of data.

32. Logic for shifting data from registers, wherein the logic is capable of performing:

shifting bits from N registers as input to a first set of M multiplexors;

sending control signals into each of the first set of M multiplexors to select bits inputted from one of the registers;

outputting the selected bits to each of a second set of M multiplexors;

sending control signals into each of the second set of M multiplexors to select bits inputted from each of the first set of multiplexors, wherein each of the M multiplexors in the first and second sets have N divided by M inputs.

33. The logic of claim 32, wherein the logic is further capable of performing:

using a counter to generate a four bit control word;

for each multiplexor in the first set, sending two bits of the control word to each multiplexor using two bits of the control word to determine the control signal for the multiplexor; and for each multiplexor in the second set, sending two bits of the control word to the multiplexor.

34. The method of claim 1, wherein each multiplexor in the first and second sets has a same number of inputs.

35. The system of claim 12, wherein each multiplexor in the first and second sets has a same number of inputs.

36. The logic of claim 23, wherein each multiplexor in the first and second sets has a same number of inputs.

* * * * *

UNITED STATES PATENT AND TRADEMARK OFFICE
CERTIFICATE OF CORRECTION

PATENT NO.     : 6,449,328 B1
DATED          : September 10, 2002
INVENTOR(S)    : Stephen Dale Hanna It is certified that error appears in the above-identified patent and that said Letters Patent is hereby corrected as shown below:

<u>Column 7,</u>
Line 3, after "each" insert -- input --.
Line 4, after "the" insert -- output from the --.

Signed and Sealed this

Thirty-first Day of May, 2005

JON W. DUDAS
*Director of the United States Patent and Trademark Office*